United States Patent
Taniguchi

(10) Patent No.: US 7,579,122 B2
(45) Date of Patent: Aug. 25, 2009

(54) METHOD OF EXPOSURE AND ATTENUATED TYPE PHASE SHIFT MASK

(75) Inventor: Yukio Taniguchi, Yokomaha (JP)

(73) Assignee: Kabushiki Kaisha Ekisho Sentan Gijutsu Kihatsu Center, Yokohama (JP)

( * ) Notice: Subject to any disclaimer, the term of this patent is extended or adjusted under 35 U.S.C. 154(b) by 524 days.

(21) Appl. No.: 11/399,288

(22) Filed: Apr. 5, 2006

(65) Prior Publication Data

US 2006/0240337 A1 Oct. 26, 2006

(30) Foreign Application Priority Data

Apr. 6, 2005 (JP) .............................. 2005-110119

(51) Int. Cl.
*G03F 1/00* (2006.01)
(52) U.S. Cl. .......................................................... 430/5
(58) Field of Classification Search ................... 430/5
See application file for complete search history.

(56) References Cited

U.S. PATENT DOCUMENTS 5,916,712 A * 6/1999 Miyashita et al. ............... 430/5
6,852,455 B1 * 2/2005 Lyons et al. ..................... 430/5
2004/0166422 A1 * 8/2004 Yamazoe et al. ................ 430/5

FOREIGN PATENT DOCUMENTS

| CN | 1174613 A | 2/1998 |
| EP | 1182504 A2 | 8/2001 |
| WO | WO97/15866 | 1/1997 |

OTHER PUBLICATIONS

Office action (Jul. 4, 2008) in connection with Chinese Pat. Appl. No. 2006100732081, which corresponds with U.S. Appl. No. 11/399,288.
Machine translation of References BB (and BC).
English translation of the relevant portions of the Jul. 4, 2008 Office action (Reference BD) in connection with Chinese Pat. Appl. No. 2006100732081, which corresponds with U.S. Appl. No. 11/399,288.
I. Tanabe, Y. Takehana and M. Hoga, "On art of Photo Mask" issued Oct. 20, 1997, by Kabushiki Kaisha Kogyo Chosakai (pp. 229-232).

* cited by examiner

*Primary Examiner*—S. Rosasco
*Assistant Examiner*—Jonathan Jelsma
(74) *Attorney, Agent, or Firm*—Stoel Rives LLP

(57) ABSTRACT

A method of exposing a surface to be exposed and an attenuated type phase shift mask for use in the method are provided herein. The attenuated type phase shift mask has a reference area allowing a light radiated from a light source to pass through and an amplitude and phase modulation area allowing a part of said light to pass through. The phase modulation amount of the amplitude and phase modulation area relative to the reference area of the attenuated type phase shift mask is $\{360°\times n+(182°$ to $203°)\}$ (n is an integer).

4 Claims, 15 Drawing Sheets

Fig. 14

| Structure | Phase shift modulation amount (deg) | | |
|---|---|---|---|
| | Lower limit | Optimum value | Upper limit |
| Mask in Fig. 3 | 193 | 198 | 203 |
| Mask in Fig. 3 | 182 | 187 | 192 |
| Mask in Fig. 3 | 184 | 189 | 194 |
| Mask in Fig. 6 | 189 | 194 | 199 |
| Mask in Fig. 5 | 185 | 190 | 195 |

…

METHOD OF EXPOSURE AND ATTENUATED TYPE PHASE SHIFT MASK

RELATED APPLICATIONS

This application claims priority from Japanese Patent Application No. 2005-110119, filed Apr. 6, 2005.

TECHNICAL FIELD

The present invention relates to an attenuated type phase shift mask and a method of exposure by using the mask.

BACKGROUND

In manufacturing a semiconductor device, a display, and the like, lithography is used for exposing and transferring, on a face of a photo resist coated on a material (layer) provided on a substrate made of a semiconductor, glass, resin, or the like, a pattern of an electronic circuit (hereinafter called "pattern") formed on a photo mask. The art of photolithography is also used in a manufacturing process of a liquid crystal display, which is characterized as follows.

For example, in the photolithography in the manufacturing process of the liquid display, a magnification of exposure is equalized in order to expose a face of a large area at great speed.

Also, there is an advantage that a deep depth of focus can be obtained by using a shorter wavelength than an i-ray (365 nm in wavelength) currently in great use. For obtaining such a short wavelength, an idea of using an eximer laser, for example, can be conceived. However, because an eximer laser is expensive and unstable in oscillation, maintenance thereof is difficult. Therefore an i-ray of an ultra-high-pressure mercury lamp is used, because it is relatively inexpensive, stable in motion, and easily maintainable.

Further, because of a demand for miniaturization of a pattern to be exposed, it is sought to miniaturize a dimension to be exposed while maintaining the magnification and wavelength of exposure. However, so long as an actual chrome mask is used, miniaturization of a dimension to be exposed results in reduction in depth of focus. It is, therefore, attempted to adopt an attenuated type phase shift mask capable of obtaining a relatively deep depth of focus.

The attenuated type phase shift mask comprises a reference area allowing a light radiated from a light source to pass and an amplitude and phase modulation area allowing a part of the light to pass. According to the attenuated type phase shift mask, the light having passed the reference area and the light having passed the phase shift modulation area have inverted phases (with a phase difference of 180°), thereby causing in a boundary of both passing lights a lowering in light intensity due to the phase inversion and a constraining spread toward the bottom of the light intensity distribution in the face to be exposed ("On Art of Photo Mask" issued by Kabushiki Kaisha Kogyo Chosakai on Oct. 20, 1997, pp. 229-232). Therefore, a deeper depth of focus than that of the chrome mask can be obtained.

It is possible to judge the depth of focus of a photo mask generally by seeing the light intensity distribution (aerial image) in the vicinity of an image plane. That is to say, when a change of the light intensity distribution is small with respect to the direction of an optical axis, the depth of focus can be judged to be deep. The depth of focus in the attenuated type phase shift mask can also be evaluated by the light intensity distribution in the vicinity of the image plane, and it is known that a change of the light intensity is smaller than that of the chrome mask with respect to the direction of the optical axis, namely, that the depth of focus is deep. It is known that, when the pattern of the mask is sufficiently large in comparison with the wavelength, the light intensity distribution in the vicinity of the image plane is symmetric (mirror symmetry) with respect to the image plane.

However, the inventor's study revealed that even by the attenuated type phase shift mask, when the dimension of the pattern formed thereon is as large as or smaller than the wavelength of the source light, a change of its light intensity distribution with respect to the optical axis becomes large and the light intensity distribution becomes asymmetric with respect to the image plane. This resulted in the problem of a shallow depth of focus.

SUMMARY

An object of some embodiments is to provide an attenuated type phase shift mask and/or a method of exposure by using the mask that makes an aerial image symmetrical with respect to an image plane even if the dimension of a pattern formed thereon is about the same size as the wavelength of a source light, and thereby, a change of the light intensity distribution in the optical axis is made small to deepen the depth of focus.

Some embodiments relate to a method of exposing a surface to be exposed by using an attenuated type phase shift mask having a reference area allowing a light radiated from a light source to pass and an amplitude and phase modulation area allowing a part of the light to pass, and is characterized in that the value φ of the following formulae in the amplitude and phase modulation area of the attenuated type phase shift mask is greater than the value φ of the following formulae in the reference area by 182° to 203°.

$$\phi = \phi 1 - \phi 2$$

$$\phi 1 = 360° \times \sum_i n_i \times t_i / \lambda$$

(i: number of the phase modulation layer existing in each area; $n_i$: refraction factor of the $i^{th}$ phase modulation layer existing in each area; $t_i$: thickness of the $i^{th}$ phase modulation layer existing in each area; $\lambda$: wavelength of light)

$$\phi 2 = \sum_i \arg\{2(n_i - ik_i)/(n_i + n_{i+1} - i(k_{i+1}))\}$$

(i: number of the layer defining an interface existing in each area; $n_i$: refraction factor of the $i^{th}$ layer defining the interface existing in each area; $k_i$: extinction index of the $i^{th}$ layer defining the interface existing in each area)

Another embodiment relative to the exposure method is characterized in that the phase modulation amount of the amplitude and phase modulation area with respect to the reference area of the attenuated type phase shift mask has a value exceeding 180°, making on the positive side when a wavefront of a light immediately passing said phase shift mask shifts to the side of said light source, and on the negative side when the wavefront of the light immediately after passing said phase shift mask shifts to the side of said surface to be exposed.

Still another embodiment relative to the exposure method is characterized in that the phase modulation amount of the amplitude and phase modulation area with respect to the reference area of the attenuated type phase shift mask is {360°×n+(182° to 203°)} where n is an integer, making on the positive side when a wavefront of a light immediately passing said phase shift mask shifts to the side of said light source, and on the negative side when the wavefront of the light immediately after passing said phase shift mask shifts to the side of said surface to be exposed.

The light source and the light can respectively be an ultra-high-pressure mercury lamp and the i-ray radiated therefrom. Image formation on the surface to be exposed can be made by using an imaging optical system of ½ times to the same magnification. The reference area can include an isolation pattern whose minimum diameter is 0.4 to 0.8 μm.

Also, some embodiments relate to an attenuated type phase shift mask having a reference area allowing a light radiated from a light source to pass and an amplitude and phase modulation area allowing a part of the light to pass, and is characterized in that the value of φ in the following formulae in the amplitude and phase modulation area of the attenuated type phase shift mask is greater than the value of φ in the following formulae in the reference area by 182° to 203°.

$$\phi = \phi 1 - \phi 2$$

$$\phi 1 = 360° \times \sum_i n_i \times t_i / \lambda$$

(i: number of the phase modulation layer existing in each area; $n_i$: refraction factor of the $i^{th}$ phase modulation layer of existing in each area; $t_i$: thickness of the $i^{th}$ phase modulation layer existing in each area; λ: wavelength of the light)

$$\phi 2 = \sum_i \arg\{2(n_i - ik_i)/(n_i + n_{i+1} - i(k_i + k_{i+1}))\}$$

(i: number of a layer defining an interface existing in each area; $n_i$: refraction factor of the $i^{th}$ layer defining the interface existing in each area; and $k_i$: extinction index of the $i^{th}$ layer defining the interface existing in each area)

Another invention relative to the attenuated type phase shift mask is characterized in that the phase modulation amount of the amplitude and phase modulation area relative to the reference area of the attenuated type phase shift mask is of a value exceeding 180°, making on the positive side when a wavefront of a light immediately passing said phase shift mask shifts to the side of said light source, and on the negative side when the wavefront of the light immediately after passing said phase shift mask shifts to the side of said surface to be exposed.

Still another embodiment relative to the attenuated type phase shift mask is characterized in that the phase modulation rate of the amplitude and phase modulation area with respect to the reference area of the attenuated type phase shift mask is {360°×n+(182° to 203°)} (n is an integer).

Still another embodiment relative to the attenuated type phase shift mask is characterized in that the amplitude and phase modulation area of the attenuated type phase shift mask has a layer structure of which the light intensity distribution in the vicinity of an image plane becomes symmetric with respect to the image plane.

In some embodiments, φ1 in the above formulae represents a phase difference caused when a light is transmitted through materials respectively constituting the reference area and the amplitude and phase modulation area in the attenuated type phase shift mask, and φ2 represents a phase jump (phase shift) caused on the interface of the materials.

According to some embodiments relative to the attenuated type phase shift mask and the method of exposure using it, it is possible to make the light intensity distribution with respect to the attenuated type phase shift mask, namely, the aerial image, symmetrical about the image plane and to decrease a shift with respect to the direction of the optical axis by setting the value of φ=φ1−φ2 in the reference area from the value of φ=φ1−φ2 in the amplitude and phase modulation area at 182° to 203°. Therefore, a comparatively deep depth of focus can be obtained. In view of this, even a glass base plate having a comparatively great unevenness of substrate thickness could be used as an exposed base plate.

Additional objects and advantages of this invention will be apparent from the following detailed description of preferred embodiments thereof, which proceeds with reference to the accompanying drawings.

BRIEF DESCRIPTION OF THE DRAWINGS

FIG. 11(b) is the same as FIG. 9(a).
FIG. 14 is a table showing the optimum value, its upper limits, and the lower limits of the phase modulation amount concerning attenuated type phase shift masks of different types according to the present invention.

DETAILED DESCRIPTION OF EMBODIMENTS

Figure 1:
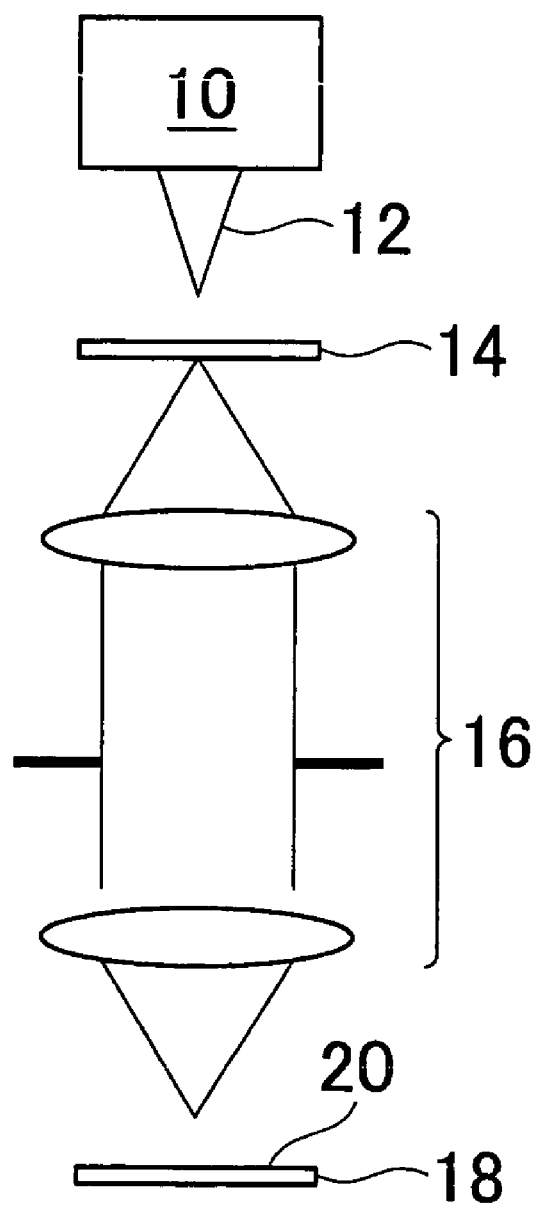
FIG. 1 is a schematic diagram of the exposure apparatus.

Referring to FIG. 1, which explains the method of exposure according to the present invention, a light 12 radiated from a light source 10 passes through an attenuated type phase shift mask 14 (hereinafter called the "mask"), passes through an image-forming optical system 16 including a lens, arrives at a surface 20 (the surface to be exposed) defined by a photo resist to be exposed and coated on a substance 18 including a silicon wafer, a glass base plate, a resin base plate, and the like to expose the surface to be exposed 20. Thereby, a pattern (see FIG. 2) formed on the mask 14 is transferred to the surface to be exposed 20. The surface 20 to be exposed is disposed in an image plane determined by the image-forming optical system 16 or in its vicinity. The exposure magnification can be ½ times to 1 times.

The light source 10 is, for example, an ultra-high-pressure mercury lamp, and the light 12 to be radiated from the mercury lamp includes an i-ray (365 nm in wavelength).

Figure 2:
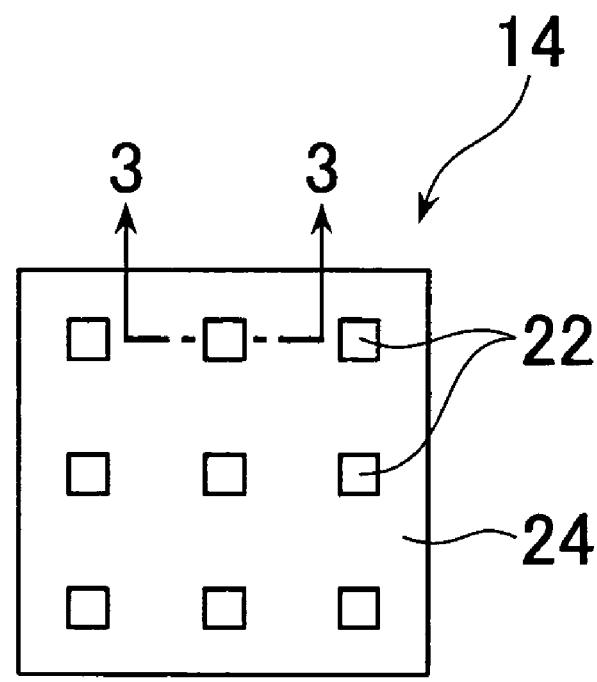
FIG. 2 is a plan view of one example of an attenuated type phase shift mask.

As shown in FIG. 2, the mask 14 has a plurality of reference areas 22 allowing the light 12 to pass, and an amplitude and phase modulation area 24 allowing a part of the light 12 to pass through. Here, with respect to the fight passage, a light of a predetermined wavelength defined by the light source 10 is taken into consideration. Also, allowing a part of the light 12 to pass through means that only a part of the light energy is passed through, that is, the light energy is attenuated. Also, in the reference areas 22, the light attenuation is smaller than in the amplitude and phase modulation area 24. In the illustration, the individual reference areas 22 define an isolation pattern having a rectangular planar shape. For this reason, the isolation pattern is exposed on the surface to be exposed 20. The isolation pattern can have, for example, a side with a length between 0.4 and 0.8 μm (the minimum length, or the minimum diameter in a case of a circular form).

As shown in FIGS. 3 through 7, the mask 14 comprises a quartz base plate 26 and an attenuated film 28 laminated on the surface thereof, while the reference area 22 is made of a part of the quartz base plate 26, and the amplitude and phase modulation area 24 includes the attenuated film 28 and another part of the quartz base plate 26 located directly below.

The attenuated film 28 is made of light-absorbing materials such as CrON, MoSiON, WSiON, and SiN and absorbs about 99% to 80% of the light passing therethrough. Therefore, the reference areas 22 have substantially 100% light transmittance, while the amplitude and phase modulation area 24 has about 1% to 20% light transmittance.

For this reason, the light passing through the amplitude and phase modulation area 24 is not only modulated in its phase as mentioned later, but also its amplitude is modulated simultaneously.

Figure 3:
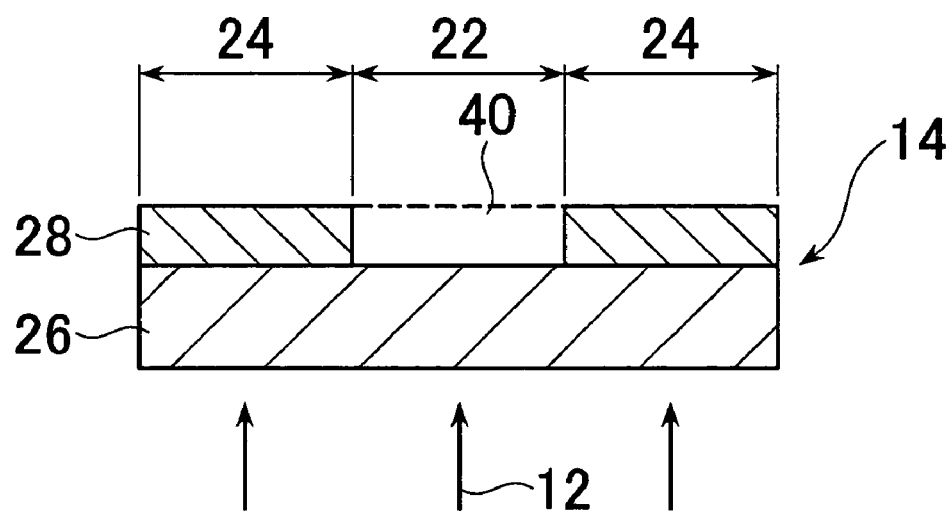
FIG. 3 is a sectional view obtained along the line 3-3 in FIG. 2.
Figure 4:
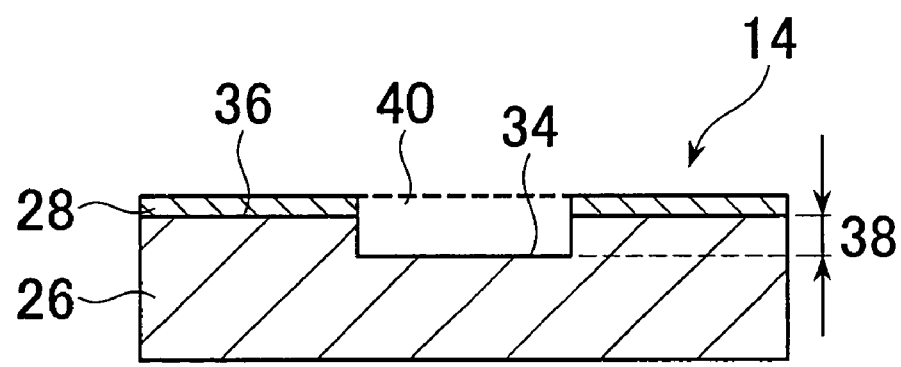
FIG. 4 is a sectional view similar to FIG. 3 of another example of the attenuated type phase shift mask.
Figure 5:
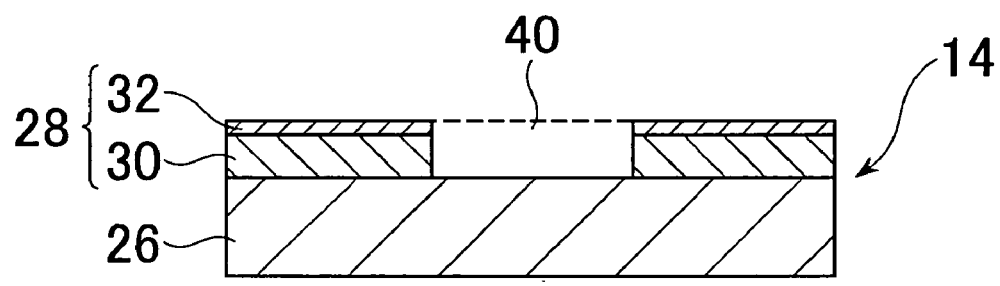
FIG. 5 is a sectional view similar to FIG. 3 of still another example of another attenuated type phase shift mask.
Figure 6:
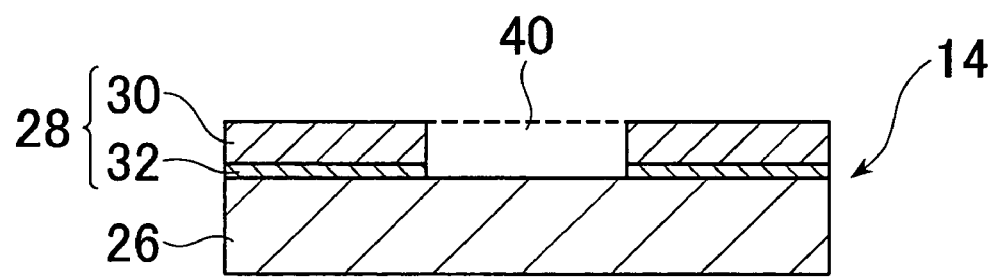
FIG. 6 is a sectional view similar to FIG. 3 of still another example of another attenuated type phase shift mask.
Figure 7:
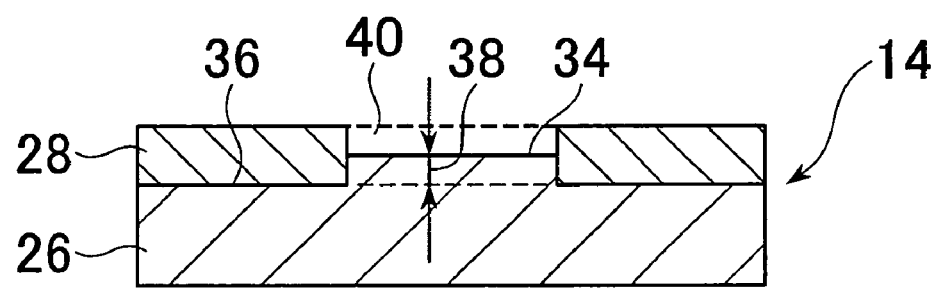
FIG. 7 is a sectional view similar to FIG. 3 of still another example of another attenuated type phase shift mask.

The attenuated film 28 forming a part of the amplitude and phase modulation area 24 can be made of a single layer as shown in FIGS. 3, 4, and 7; two layers 30, 32 as shown in FIGS. 5 and 6; or three or more multiple layers (not shown). As shown in FIGS. 5 and 6, it is possible to reverse the vertical positions of the two layers 30, 32, which have different thickness dimensions.

Also, as shown in FIGS. 4 and 7, it is possible to implement a step between the surface 34 (the upper face in the illustration) of the quartz base plate 26 in the reference area 22 and the surface 36 in the amplitude and phase modulation area 24.

In the example shown in FIG. 4, a part of the quartz base plate 26 is cut out, and the surface 34 in the reference area 22 in the drawing is in a lower position than the surface 36 in the amplitude and phase modulation area 24. In the example shown in FIG. 7, a part of the attenuated film 28 is disposed so as to be partially embedded in the quartz base plate 26, so that the surface 34 in the reference area 22 is, to the contrary, positioned higher than the surface 36 in the amplitude and phase modulation area 24.

A difference in layer structure between the reference area 22 and the amplitude and phase modulation area 24 causes a phase difference. When single layer or multiple layers contribute to cause a phase difference, it is herein called "phase modulation layer(s)". In the illustration of FIG. 4, for example, an air layer 40 in the reference area 22 is a phase modulation layer, while in the amplitude and phase modulation area 24, the layer 38 that is a part of the quartz base plate 26 and the attenuated film 28 are phase modulation layers.

The phase modulation amount to be obtained by the mask 14 according to some embodiments exceeds 180°, preferably 182° to 203° in magnitude, and in more detail, {360°×n+ (from 182° to 203°)} (n is an integer). By setting the phase modulation amount at such a value, the depth of focus can be made greater, that is, deeper than when it is set at the conventional phase modulation amount of 180°, making on the positive side when a wavefront of a light immediately passing said phase shift mask shifts to the side of said light source, and on the negative side when the wavefront of the light immediately after passing said phase shift mask shifts to the side of said surface to be exposed.

Such an effect can be obtained, as mentioned later, by making the amplitude and phase modulation area 24 in terms of the attenuated type phase shift mask 14 have a layer structure such that the light intensity distribution in the vicinity of the image plane becomes symmetric with respect to the image plane.

The phase modulation amount is a difference in values, φ(=φ1−φ2), obtained by applying the following two formulae to both areas 22 and 24 of the mask 14:

$$\phi 1 = 360° \times \sum_i n_i \times t_i / \lambda$$

in which i is the number of a layer defining an interface existing in each area 22 or 24, $n_i$ is a refraction factor of the $i^{th}$ phase modulation layer defining an interface existing in each area 22 or 24, $t_i$ is the thickness of the $i^{th}$ phase modulation layer existing in each area 22 or 24, and λ is the wavelength of the light 12.

$$\phi 2 = \sum_i \arg\{2(n_i - ik_i)/(n_i + n_{i+1} - i(k_i + k_{i+1}))\}$$

in which i is the number of the phase modulation layer existing in each area 22 or 24, $n_i$ is a refraction factor of the $i^{th}$ layer existing in each area 22 or 24, and $k_i$ is an extinction index of the $i^{th}$ layer defining an interface existing in each area 22 or 24. Number i shall be given in order from the light source side. The material or layer outside the outermost interface should also be taken into consideration. In the phase modulation area 24 in the structure of FIG. 3, for example, the air layer 40 contacting the base plate 26 and the attenuated film 28 is also taken into consideration. Incidentally, in obtaining φ, on the positive side when a wavefront of a light immediately passing said phase shift mask shifts to the side of said light source, and on the negative side when the wavefront of the light immediately after passing said phase shift mask shifts to the side of said surface to be exposed. It is for this reason to add φ1 as plus and φ2 as minus in obtaining φ.

As is evident from the above formula of φ1, the phase modulation amount can be set at a greater value by thickening the phase modulation layer. It is, however, desirable not to change the amplitude and phase modulation amount when changing the phase modulation amount. For example, if the attenuated film 28 contains of a single layer, by changing the composition of material of the single layer, and if it contains multiple layers, by utilizing the difference in optical characteristics of the respective layers, the thickness of each layer is adjusted without changing the composition of materials, thereby controlling the phase modulation amount and the amplitude and phase modulation amount at the same time.

In the example of the mask 14 shown in FIG. 3, the phase modulation layer in the above formula of φ1 is the air layer 40 in the reference area 22 and the attenuated film 28 in the amplitude and phase modulation area 24. Also, in the examples shown in FIGS. 5 and 6, the phase modulation layer is the air layer 40 in the reference area 22 and the attenuated film 28 (layers 30, 32) in the amplitude and phase modulation area 24, respectively.

On the other hand, in the example shown in FIG. 7, the phase modulation layer is a portion 38 of the quartz base plate 26 and the air layer 40 in the reference area 22, and the attenuated film 28 in the amplitude and phase modulation area 24.

As may be understood from the above explanation, in calculating the above-mentioned φ1, as regards the portions common to the reference area 22 and the amplitude and phase modulation area 24, namely, the quartz base plate 26 in the examples of FIGS. 3, 5, and 6 and the portion below the portion 38 in the quartz base plate 26 in the examples of FIGS. 4 and 7, the element $n_i$ in the formula of φ1 in the calculation of φ is cancelled out, so that practically it is not necessary to make these common portions elements of the formula φ1.

Next, the layers defining the interface in the formula of φ2 are, in the examples shown in FIGS. 3, 5, and 6, respectively, the quartz base plate 26 and the air layer 40 in contact therewith in the reference area 22, and the quartz base plate 26 and the attenuated film 28 (the layers 30, 32 in the examples of FIGS. 5 and 6) in the amplitude and phase modulation area 24 and the air layer 40 in contact therewith. Also, in the example shown in FIG. 4, it is the quartz base plate 26 and the air layer 40 in contact therewith in the reference area 22, while it is the quartz base plate 26, the portion 38, the attenuated film 28, and the air layer 40 in contact therewith in the amplitude and phase modulation area 24. In the example shown in FIG. 7, it is the quartz base plate 26, the layer 38, and the air layer 40 in contact therewith in the reference area 22, while it is the quartz base plate 26, the attenuated film 28, and the air layer 40 in contact therewith in the amplitude and phase modulation area 24. In the calculation of φ2, different from the calculation of φ1, the layer structure of the common portions should be taken into consideration.

The formula φ1 represents a phase difference of the light 12 caused when the light 12 transmits through the phase modulation layer.

Also, the formula of φ2 represents a phase jump (phase shift) of the light 12 caused in the interface between the mutual layers. This is a phase angle of Fresnel factor (ratio of a complex amplitude of light), $T = 2(n_i - ik_i)/(n_i + n_{i+1} - i(k_i + k_{i+1}))$, in the interfaces of the layers when a light is incident from a layer having the refraction factor $n_i$ and the extinction index $k_i$ on a layer having the refraction factor $n_{i+1}$ and the extinction index $k_{i+1}$.

In the calculation of φ, influence of repeated reflection by the interface is not taken into consideration. This is because, in the attenuated type phase shift mask 14, the extinction index, namely, the absorption index of the layers, is great, and the influence can be ignored.

The phase modulation amount and the transmittance of the mask 14 can be measured by a phase difference measuring device (e.g., a system using the Mach-Zehnder interferometer) even if the layer structure is not known. Also, the refraction factor and the extinction index of the layers can be measured by an ellipsometer.

Next, concerning the mask 14 having an attenuated film 28 made of a single layer shown in FIG. 3, aerial images (light intensity distribution maps) in the vicinity of the image plane when materials and thickness of the attenuated film 28 are varied are shown in FIGS. 8(a), 9(a), and 10(a) as well as in FIGS. 8(b), 9(b) and 10(b), respectively. As for the pattern of the mask 14, a square of 0.5 μm square (as in FIG. 2) was used. In these figures, the light intensity is shown by contours, and among the parts surrounded by these contours, the light intensity is the highest in the part surrounded by the innermost contour. The value of the light intensity is standardized such that the intensity corresponding to the mask 14 having 100% transmittance is determined as 1. Also, in the upper part of each figure, the set value (T) of the thickness of the attenuated film and the obtained phase modulation amount (°) are shown. Incidentally, the phase modulation amount is a value obtained by the formula φ.

Figure 8:
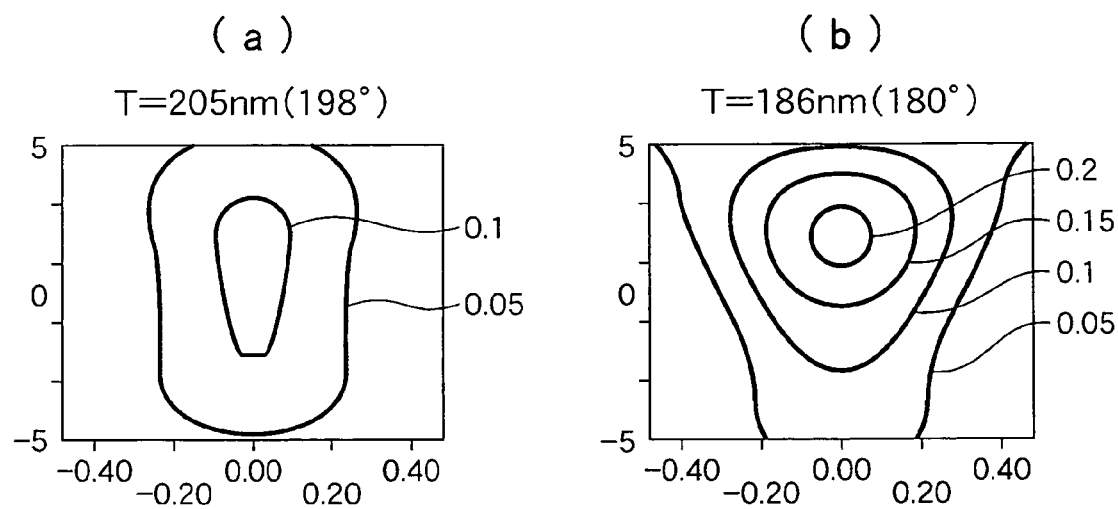
FIG. 8(a) is an aerial image (light intensity distribution view) obtained by using an attenuated type phase shift mask according to the present invention.
FIG. 8(b) is an aerial image obtained by using a conventional attenuated type phase shift mask.
Figure 9:
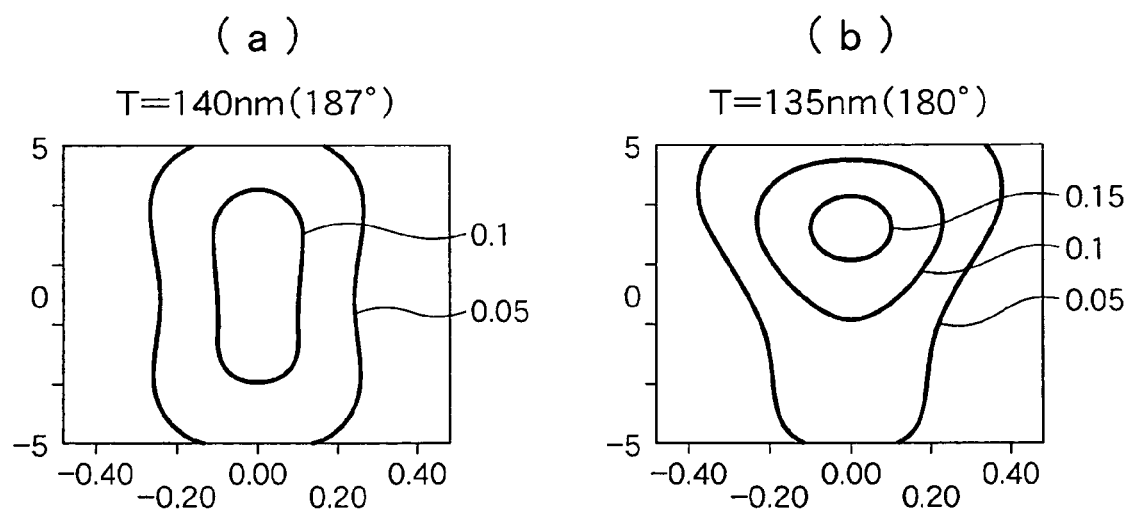
FIG. 9(a) is an aerial image obtained by using an attenuated type phase shift mask having another phase modulation rate according to the present invention.
FIG. 9(b) is an aerial image obtained by using a conventional attenuated type phase shift mask.
Figure 10:
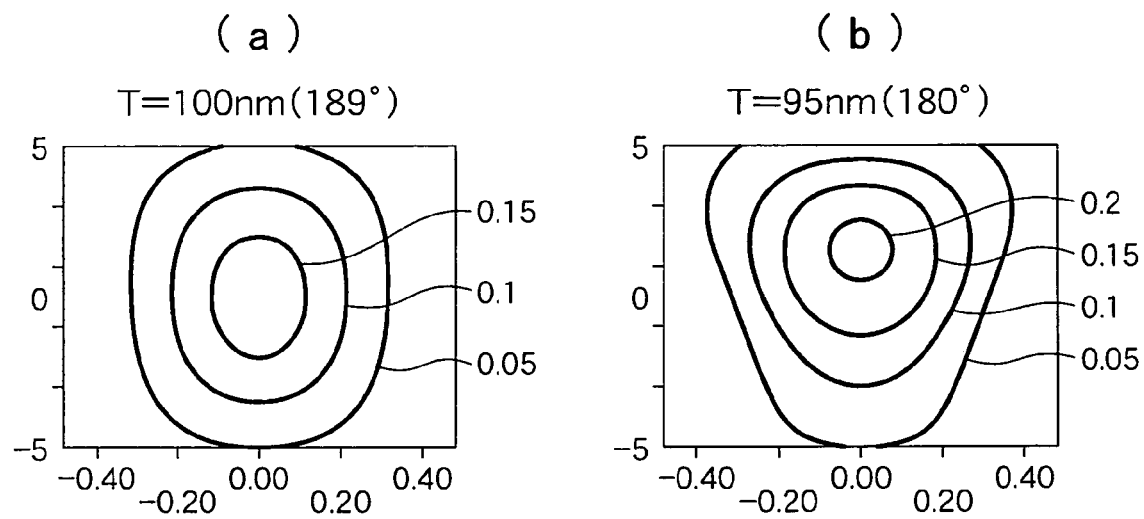
FIG. 10(a) is an aerial image obtained by using an attenuated type phase shift mask having still another phase modulation rate according to the present invention.
FIG. 10(b) is an aerial image obtained by using a conventional attenuated type phase shift mask.

The optical characteristics of the attenuated films in the masks shown in FIGS. 8, 9, and 10 are respectively n=2.0 and k=0.519, n=2.40 and k=0.719, and n=3.0 and k=1.04.

The vertical axis and the horizontal axis in each figure respectively show the distance (μm) from the image plane and the coordinate (μm) on the image plane. In the vertical axis, 0 represents that a surface including the vertical axis is the image plane. As for the values of the vertical axis, those close to the imaging optical system are positive. Also, 0 in the horizontal axis represents the center of a rectangular pattern.

As is evident from FIGS. 8(b), 9(b), and 10(b), when the phase difference (phase modulation amount) is set at 180°, the light intensity distribution is asymmetric with respect to the image plane. Because of this, a change in direction of the optical axis is great. In other words, the depth of focus is shallow. On the other hand, as is apparent from FIGS. 8(a), 9(a) and 10(a), when the phase difference is set to be greater than 180°, the light intensity distribution is symmetric with respect to the image plane. Therefore, change in the direction of the optical axis is small. That is, the depth of focus is deep. This shows that the mask 14 according to the present invention with a phase modulation amount exceeding 180° has a deeper depth of focus than a mask with a phase modulation amount of 180°.

Figure 11:
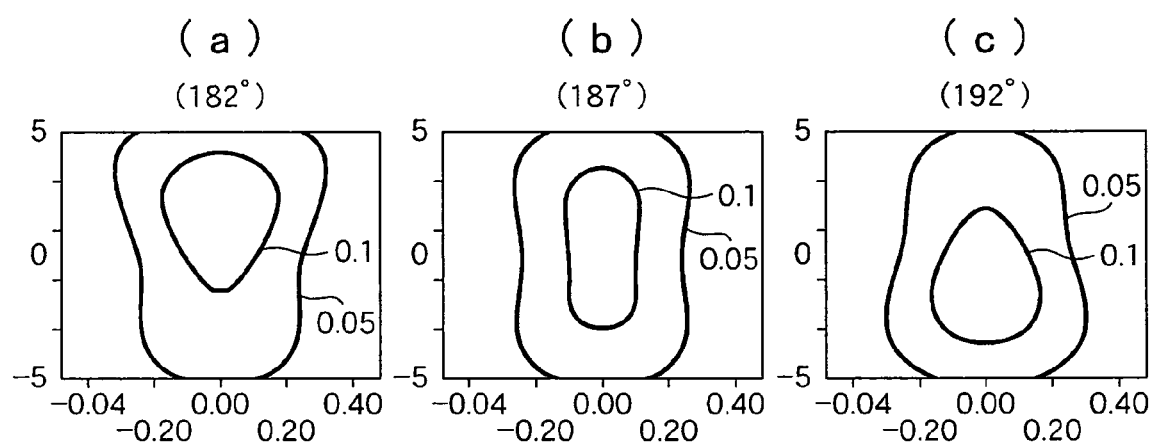
FIGS. 11(a), 11(b), and 11(c) are aerial images obtained by using the attenuated type phase shift mask used for FIG. 9, respectively preset at different phase modulation rates.

Next, the aerial images when the condition in the example of FIG. 9(a) is maintained and the thickness of the attenuated film 28 is varied are shown in FIGS. 11(a), 11(b) and 11(c). However, FIG. 11(b), which is the same as FIG. 9(a), is again shown just for reference.

FIGS. 11(a) and 11(c) respectively show the aerial images with the phase modulation amount (187°) shown in FIG. 11(b) as the optimum value and when the differences between this value and the phase modulation amounts (192° and 182°) are respectively ±5°. These aerial images can be said to be substantially vertically symmetric in the drawings. Feasibility of the symmetry such as mentioned above under the phase modulation amount within the range of ±5° from the optimum value of the phase modulation amount was likewise in the other masks 14 shown in FIGS. 4 through 7.

According to the above calculation, it is possible to confirm that, when the phase modulation amount exceeds the range of ±5° from the optimum value, the symmetry of the aerial images is completely broken, and the depth of focus becomes shallow.

The results of a study conducted with respect to the examples of the masks 14 in FIGS. 5 and 6, similar to the study conducted with respect to those shown in FIGS. 8 through 10, are respectively shown in FIGS. 12(a) and 12(b) and FIGS. 13(a) and 13(b).

Figure 12:
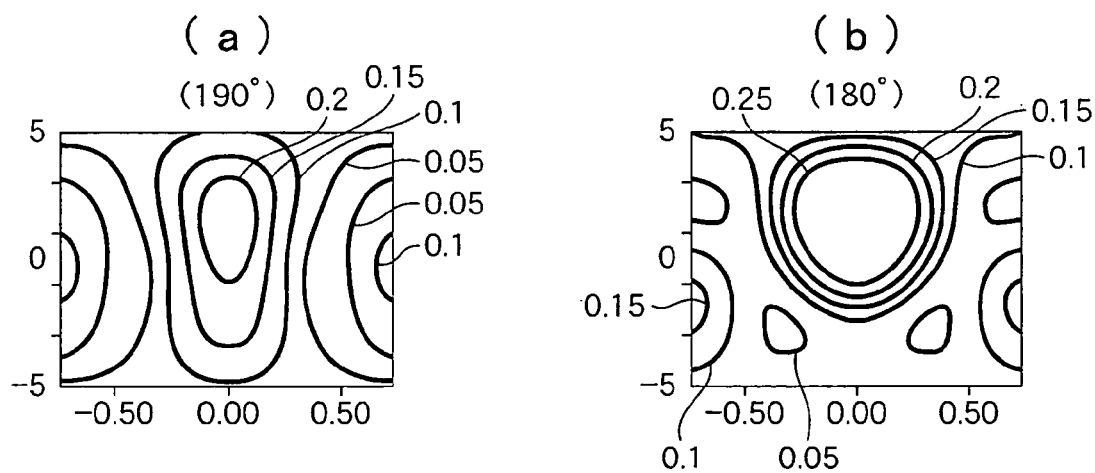
FIG. 12(a) is an aerial image obtained by using an attenuated type phase shift mask having another phase modulation rate.
FIG. 12(b) is an aerial image obtained by using a conventional attenuated type phase shift mask of the same type.

In the example shown in FIG. 12, the layers 30, 32 of the attenuated film 28 are respectively made of CrON and CrN, with the respective thicknesses of 135 nm and 20 nm in FIG. 12(a), and 128 nm and 20 nm in FIG. 12(b). In the example shown in FIG. 13, the layers 32, 30 of the attenuated film 28 are respectively made of CrN and CrON, with the respective thicknesses of 20 nm and 135 nm in FIG. 13(a), and 20 nm and 125 nm in FIG. 13(b).

Figure 13:
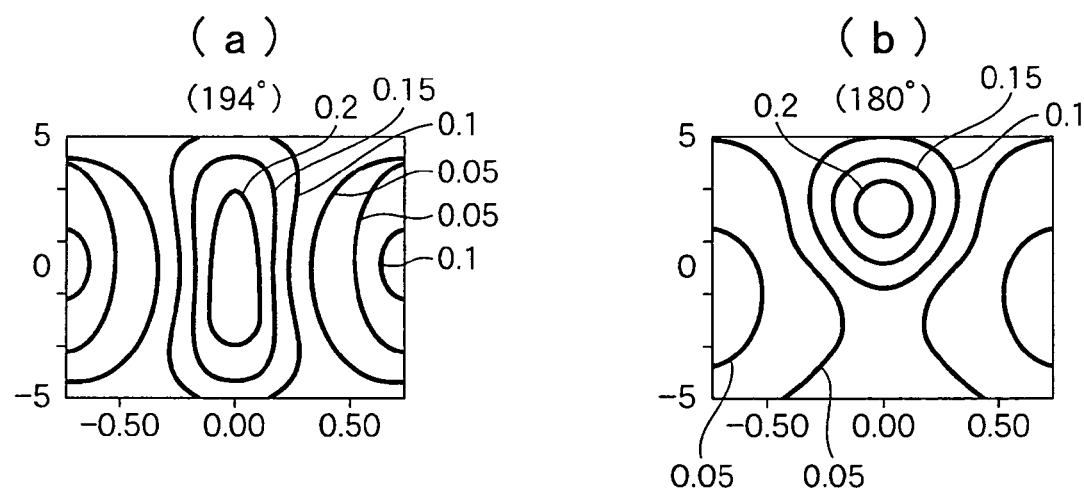
FIG. 13(a) is an aerial image obtained by using an attenuated type phase shift mask having still another phase modulation rate according to the present invention.
FIG. 13(b) is an aerial image obtained by using a conventional attenuated type phase shift mask of the same type.

The optimum values of the phase modulation amounts in the examples shown in FIGS. 12 and 13 are respectively 190° and 194°, and it is understood that the optimum phase difference in this layer structure is greater than 180°.

FIG. 14 shows the optimum phase modulation amount resulting from FIGS. 8 through 10 (concerning the mask 14 of the structure shown in FIG. 3) and one resulting from FIG. 12 (concerning the mask 14 of the structure shown in FIG. 5), and the optimum phase modulation amount resulting from FIG. 3 (concerning the mask 14 of the structure shown in FIG. 6), together with the upper-limit value (at +5°) and the lower-limit value (at −5°).

Figure 15:
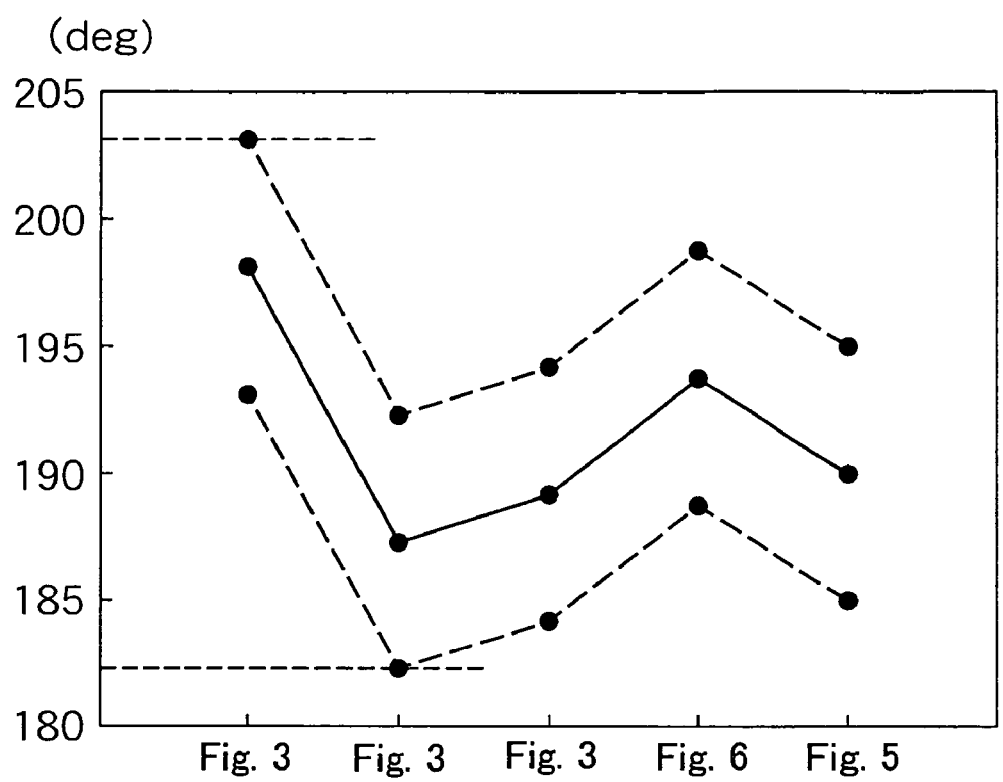
FIG. 15 is a graph obtained by plotting the values shown in FIG. 14.

The values shown in FIG. 14 can be graphed such as in FIG. 15. The broken line represented by a solid line shows the optimum modulation amount for each mask, and the broken lines represented by the dotted lines above and below the solid line show the upper-limit value and the lower-limit value, respectively.

From the graph, 182° through 203° or {360°×n+(182° to 203°)} can be obtained as the phase modulation amount for realizing an aerial image having the symmetry, namely, the phase modulation amount that enables a deep depth of focus to be obtained.

Embodiment 1

The photo resist was exposed under the following conditions:

| | |
|---|---|
| Wavelength | 365 nm (i-ray) |
| Magnification of exposure | equal magnification |
| Numerical aperture | 0.35 |
| Coherence factor σ | 0.4 |

-continued

The photo resist was exposed under the following conditions:

| | |
|---|---|
| Exposure pattern | square aperture of 0.5 µm square |
| Mask structure | The attenuated type phase shift mask 14 with the phase modulation amount of 194° as shown in FIG. 6, the quartz base plate 26 having a thickness of 6.35 mm, and the layers 32, 30 of the attenuated film 28 having thicknesses of 20 nm and 135 nm, respectively. The layers 32, 30 are respectively made of CrN and CrON. |

As a result, the depth of focus of 6 µm was obtained on the basis of a criterion that it is effective when the length of one side of the pattern on the surface (to be exposed) of the photo resist film is within a range of 0.5 µm in length ±10% thereof. For the sake of comparison, when the same exposure was carried out by using an attenuated type phase shift mask of the same structure with the phase modulation amount of 180°, the obtained depth of focus was 1 µm. It was confirmed from this that the method of exposure using embodiments of the mask presented herein enables the depth of focus to be made deeper than does the conventional method of exposure.

It will be obvious to those having skill in the art that many changes may be made to the details of the above-described embodiments without departing from the underlying principles of the invention. The scope of the present invention should, therefore, be determined only by the following claims.

The invention claimed is:

1. A method of exposing a surface to be exposed by using an attenuated type phase shift mask having a reference area allowing a light radiated from a light source to pass and an amplitude and phase modulation area allowing a part of said light to pass,
   wherein the phase modulation amount of the amplitude and phase modulation area relative to the reference area of said attenuated type phase shift mask is {360°×n +(182° to 203°)} (n is an integer) for obtaining a light intensity distribution that is symmetrical with respect to the image plane, making on the positive side when a wavefront of a light immediately passing said phase shift mask shifts to the side of said light source, and on the negative side when the wavefront of the light immediately after passing said phase shift mask shifts to the side of said surface to be exposed.

2. The method of exposure as claimed in claim 1, wherein said light source is an ultra high pressure mercury lamp, said light including an i-ray.

3. The method of exposure as claimed in claim 1, wherein imaging on said surface to be exposed is carried out by using an imaging optical system of ½ to equal magnification.

4. The method of exposure as claimed in claim 1, wherein said reference area includes an isolation pattern with the minimum diameter of 0.4 to 0.8 µm.

* * * * *

UNITED STATES PATENT AND TRADEMARK OFFICE
CERTIFICATE OF CORRECTION

PATENT NO.        : 7,579,122 B2                                   Page 1 of 1
APPLICATION NO.   : 11/399288
DATED             : August 25, 2009
INVENTOR(S)       : Yukio Taniguchi It is certified that error appears in the above-identified patent and that said Letters Patent is hereby corrected as shown below:

On the title page item (75), change "Yokomaha" to --Yokohama--.
Line 7, change "Kihatsu" to --Kaihatsu--.

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,579,122 B2
APPLICATION NO. : 11/399288
DATED : August 25, 2009
INVENTOR(S) : Yukio Taniguchi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 666 days.

Signed and Sealed this

Fourteenth Day of September, 2010

David J. Kappos
*Director of the United States Patent and Trademark Office*